United States Patent
Lohr et al.

(10) Patent No.: US 8,134,232 B2
(45) Date of Patent: Mar. 13, 2012

(54) HEAT DISSIPATION FOR INTEGRATED CIRCUIT

(75) Inventors: Mitchel E. Lohr, Windsor, CO (US); Qwai H. Low, Cupertino, CA (US)

(73) Assignee: LSI Corporation, Milpitas, CA (US)

(*) Notice: Subject to any disclaimer, the term of this patent is extended or adjusted under 35 U.S.C. 154(b) by 1014 days.

(21) Appl. No.: 12/061,728

(22) Filed: Apr. 3, 2008

(65) Prior Publication Data

US 2009/0250805 A1   Oct. 8, 2009

(51) Int. Cl.
*H01L 23/34* (2006.01)
(52) U.S. Cl. ........ 257/720; 257/706; 257/712; 257/713; 257/717; 257/796
(58) Field of Classification Search .......... 257/706, 257/712, 713, 717, 720, 796
See application file for complete search history.

(56) References Cited

U.S. PATENT DOCUMENTS

2008/0203550 A1* 8/2008 Ewe et al. .................... 257/675

* cited by examiner

*Primary Examiner* — Wael Fahmy
*Assistant Examiner* — Joannie A Garcia
(74) *Attorney, Agent, or Firm* — Luedeka Neely Group, P.C.

(57) ABSTRACT

A packaged integrated circuit having a thermal pathway to exhaust heat from the integrated circuit. The integrated circuit is disposed on a package substrate, with an encapsulant disposed around the integrated circuit. A heat sink is disposed at least partially within the encapsulant, with at least a portion of one surface of the heat sink exposed outside of the encapsulant. The integrated circuit has an uppermost passivation layer, where the passivation layer is not electrically conductive, with a port disposed in the passivation layer. The port extends completely through the passivation layer to expose an underlying layer. A thermal pathway is disposed at least partially within the port, and makes thermal contact to both the underlying layer and the heat sink. The thermal transfer rate of the thermal pathway is greater than the thermal transfer rate either the passivation layer or the encapsulant.

20 Claims, 1 Drawing Sheet

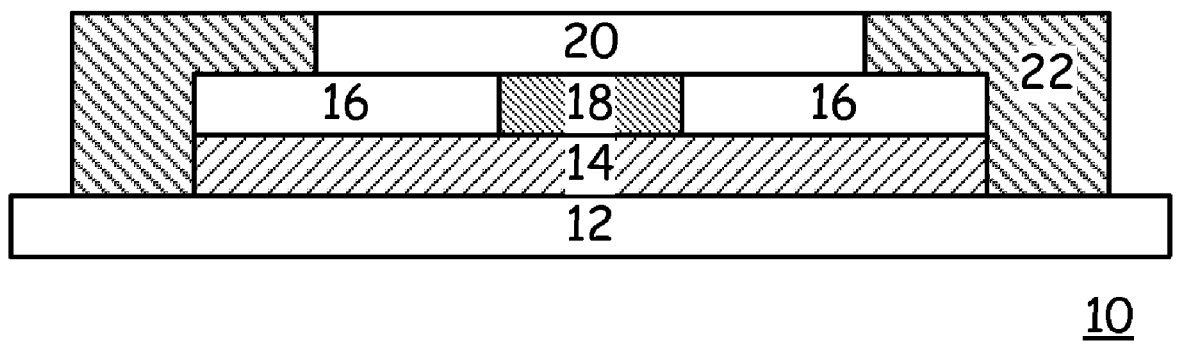

HEAT DISSIPATION FOR INTEGRATED CIRCUIT

FIELD

This invention relates to the field of integrated circuit fabrication. More particularly, this invention relates to removing heat from packaged integrated circuits.

BACKGROUND

Integrated circuits consume electricity when they are in use and, as with most devices that consume electricity, a large amount of the energy consumed is converted into heat. If the heat is allowed to build up inside of the integrated circuit, then it can damage the integrated circuit itself. If the build up of heat within the integrated circuit is great enough, then it can cause the integrated circuit to fail immediately. However, even lesser amounts of heat, if allowed to repeatedly or continually remain within the integrated circuit, can damage the integrated circuit over time. Thus, controlling the amount of heat that builds up within the integrated circuit is of vital importance to the proper operation and lifespan of the integrated circuit.

As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

Many aspects of modern integrated circuit fabrication and design tend to accentuate the problem of heat within the integrated circuit. For example, many integrated circuits are encapsulated within packages that are formed of materials that do not conduct thermal energy very well, and thus tend to trap the heat within the packaged device. Further, devices are becoming smaller and faster as time goes on. Smaller devices tend to concentrate a given amount of thermal energy within a smaller space, which makes it generally more difficult to dissipate the heat through a larger surface area. Faster devices tend to generate thermal energy as a faster rate, thus allowing heat to build up faster and to a higher temperature, if the thermal energy cannot be removed faster than it is created.

What is needed, therefore, is a system that helps overcome problems such as those described above, at least in part.

SUMMARY

The above and other needs are met by a packaged integrated circuit according to the present invention. An integrated circuit is disposed on a package substrate, with an encapsulant disposed around the integrated circuit. A heat sink is disposed at least partially within the encapsulant, with at least a portion of one surface of the heat sink exposed outside of the encapsulant. The integrated circuit has an uppermost passivation layer, where the passivation layer is not electrically conductive, with a port disposed in the passivation layer. The port extends completely through the passivation layer to expose an underlying layer. A thermal pathway is disposed at least partially within the port, and makes thermal contact to both the underlying layer and the heat sink. The thermal transfer rate of the thermal pathway is greater than the thermal transfer rate of either the passivation layer or the encapsulant.

In this manner, the thermal pathway provides a heat pipe through the passivation layer and the encapsulant between the underlying layer of the integrated circuit and the heat sink, and allows heat from the integrated circuit to dissipate at a greater rate than could be realized through the passivation layer.

BRIEF DESCRIPTION OF THE DRAWINGS

Further advantages of the invention are apparent by reference to the detailed description when considered in conjunction with the FIGURE, which is not to scale so as to more clearly show the details, wherein like reference numbers indicate like elements, and which depicts a cross sectional representation of a packaged integrated circuit according to an embodiment of the present invention.

DETAILED DESCRIPTION

With reference now to the FIGURE, there is depicted a cross sectional representation of a packaged integrated circuit 10 according to an embodiment of the present invention. The integrated circuit 14 is disposed on a package substrate 12. A potting material 22 or some other type of covering or encapsulant 22 generally seals the integrated circuit 14 to the package substrate 12. A heat sink 20 is provided in the packaged integrated circuit 10, to help dissipate heat from the integrated circuit 14. The integrated circuit 14 has an upper passivation layer 16, in which a hole has been cut clear through from the top of the passivation layer 16 to the bottom of the passivation layer 16, and in which is disposed a thermal pathway 18.

Each of these elements as introduced above is described in more detail below. It is appreciated that these descriptions are by way of example and not limitation.

The package substrate 12 may be formed of one or more of a variety of different materials, and according to one or more of a variety of different designs. For example, the package substrate 12 can be formed of ceramic, or a layered material, such as a printed circuit board. The package substrate 12 has electrical contacts and interconnections for providing signals, power, and ground from and to the integrated circuit 14 on one side of the package substrate 12, and electrical contacts on the other side of the package substrate 12 (not depicted), such as solder balls, pins, posts, or lands.

The integrated circuit 14 can be of different designs, such as a flip chip or a wire bond chip. The more prevalent example of a wire bond chip is generally described herein. For the example of a wire bond chip, the integrated circuit 14 has electrical wires (not depicted) with one end attached to an upper surface of the integrated circuit 14 (which is opposite the surface of the integrated circuit 14 that is disposed adjacent the upper surface of the package substrate 12), and the other end connected to electrical contacts on the upper surface of the package substrate 12. The electrical wires are encapsulated within the encapsulant 22. The wires are typically formed of a gold compound, and are not otherwise electrically insulated.

The passivation layer 16 can be formed of one or more of the passivation materials known in the art, such as silicon oxide, spin on glass, other oxides, nitrides, and mixtures thereof, low k material, high k material, polyimide, and other such materials. The passivation layer 16 is primarily designed for electrical isolation and physical protection of the underlying layers of the integrated circuit 14, and tends to have a relatively poor thermal conductance rate in comparison to other materials, such as metals or thermal coupling compounds.

The encapsulant 22 is formed of a material such as resin, ceramic, or epoxy, the primary purpose of which is to provide physical protection to the integrated circuit 14, such as by forming a relatively hermetic seal against the package substrate 12, so as to reduce physical damage and moisture intrusion to the integrated circuit 14. Thus, the material of the encapsulant 22 is also a relatively poor thermal conductor in comparison to other materials, such as metals or thermal coupling compounds.

The heat sink 20, sometimes referred to as a heat spreader, is preferably formed of a material that has a relatively high thermal conductance rate in comparison to the materials of the passivation layer 16, the encapsulant 22, and in some embodiments even the integrated circuit 14 and the package substrate 12. In some embodiments the heat sink 20 is formed of a metal or alloy thereof, such as copper. The heat sink 20, in some embodiments, makes physical contact with the top of the integrated circuit 14. This concept of physical contact is described in more detail below. The heat sink 20 is also exposed, at least in part, to the outside of the packaged integrated circuit 10, by having one or more surfaces that protrude from the encapsulant 22. While depicted as having a flat exposed surface, the heat sink 20 can take many other different configurations, such as having fins, slots, waves, grooves, rails, pits, dips, bumps, or other elements to generally increase the surface area of the exposed portion of the heat sink 20, so as to aid in heat transfer.

The passivation layer 16, which is considered to be the topmost layer of the integrated circuit 14, has one or more ports cut into it, in which is disposed a material for a thermal pathway 18. One such thermal pathway 18 is depicted in the FIGURE. However, it is appreciated, as introduced above, that these depictions and descriptions are by way of example and not limitation, and that in some embodiments a great number of thermal pathways 18 may be provided. The thermal pathway 18 has a thermal conductance that is greater than that of both the passivation layer 16 and the encapsulant 22, or in other words, is able to conduct thermal energy away from the integrated circuit 14 at a rate that is faster than that of both the passivation layer 16 and the encapsulant 22. The thermal pathway 18 is formed of a different material than both the passivation layer 16 and the encapsulant 22.

The thermal pathway 18 makes thermal contact with one or more of the layers of the integrated circuit 14 that underlie the topmost passivation layer 16. In some embodiments, the thermal pathway 18 makes physical and thermal contact with the topmost metal layer of the integrated circuit 14, which often directly underlies the passivation layer 16, and to which electrical connections to the integrated circuit 14 are made. In those embodiments, however, the thermal pathway 18 would normally not be electrically connected to any of the power, ground, or signal routing elements of that metal layer. In some embodiments, the thermal pathway 18 makes physical and thermal contact with dummy metal structures that extend far down into the layers of the integrated circuit 14, such as down to the semiconducting substrate of the integrated circuit 14.

The thermal pathway 18 also makes thermal contact with the heat sink 20. Thus, the thermal pathway 18 provides a heat pipe between the integrated circuit 14 and the heat sink 20, through the relatively thermally insulating layers of the passivation layer 15 and the encapsulant 22. By having thermal contact between a top metal layer of the integrated circuit 14 (which might have thermal contact with metal structures down into the integrated circuit 14) and the heat sink 20, the thermal pathway 18 is able to draw thermal energy from the integrated circuit 14 at an increased rate, and help keep the integrated circuit 14 from building up an excessive amount of heat, and is thereby able to keep the temperature of the integrated circuit 14 at a generally reduced level.

The thermal pathway 18 in some embodiments is a unified structure, formed from one end to the other of a single material of a homogeneous mixture or alloy of materials. For example, the thermal pathway 18 is formed of a metal in some embodiments. In other embodiments, portions of the thermal pathway 18 are formed of one material, and other portions of the thermal pathway 18 are formed of another material. For example, the portion of the thermal pathway 18 that is disposed adjacent the top metal layer of the integrated circuit 14 and within the opening of the passivation layer 16 may be formed of a metal, such as copper or a copper alloy, and then an upper part of the thermal pathway 18 that is disposed against the heat sink 20 may be formed of another material, such as a thermal coupling compound.

In some embodiments, the entire thermal pathway 18 is formed at the same time, such as during the wafer-form fabrication process for the integrated circuit 14, when the port is opened in the passivation layer 16, and the material of the thermal pathway 18 is thereafter deposited In other embodiments, a portion of the thermal pathway 18 is formed during the wafer-form fabrication process, but then upper portions of the thermal pathway 18 are formed at a later point in time, such as during the packaging process, when the integrated circuit 14 has been singulated. In still other embodiments, all of the thermal pathway 18 is formed after the integrated circuit 14 has been singulated. Similarly, the port 16 in the passivation layer 16 can be formed either during wafer-form processing or after the integrated circuit 14 is singulated. In most embodiments, all of the port is formed at one time.

In some embodiments, the thermal pathway 18 extends above the top surface of the passivation layer 16, at least by some amount. Thus, although the heat sink 20 ostensibly rests on top of the passivation layer 16 of the integrated circuit 14, the raised height of the thermal pathway 18 provides some addition thermal connection to the heat sink 20. In some embodiments, the thermal pathway 18 extends quite a bit above the top surface of the passivation layer 16, and some amount of the encapsulant 22 is disposed around the thermal pathway 18 between the passivation layer 16 and the heat sink 20. In some embodiments the heat sink 20 has structures that depend down from the bottom surface of the heat sink 20, and make contact with the thermal pathway 18, which could be below, at, or above the upper surface of the passivation layer 16.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A packaged integrated circuit, having:
    an integrated circuit disposed on a package substrate,
    an encapsulant disposed around the integrated circuit, the encapsulant having a first thermal transfer rate, a heat sink disposed at least partially within the encapsulant and having at least a portion of one surface of the heat sink exposed outside of the encapsulant, the heat sink having a second thermal transfer rate, the integrated circuit having an uppermost passivation layer that does not extend off of the integrated circuit, where the passivation layer is not electrically conductive and has a third thermal transfer rate, the passivation layer having a port disposed therein, the port extending completely through the passivation layer to expose an underlying layer through the passivation layer, and a thermal pathway disposed at least partially within the port, the thermal pathway making thermal contact to both the underlying layer and the heat sink, the thermal pathway having a fourth thermal transfer rate, where the fourth thermal transfer rate is greater than either of the first thermal transfer rate and the third thermal transfer rate.

2. The packaged integrated circuit of claim 1, wherein the second thermal transfer rate is substantially equal to the fourth thermal transfer rate.

3. The packaged integrated circuit of claim 1, wherein the underlying layer is a metal layer.

4. The packaged integrated circuit of claim 1, wherein the underlying layer is a metal layer that makes direct contact with a dummy metal structure that extends at least to an upper semiconducting surface of the integrated circuit.

5. The packaged integrated circuit of claim 1, wherein the passivation layer has a plurality of ports and the thermal pathway is disposed within each of the ports.

6. The packaged integrated circuit of claim 1, wherein all of the thermal pathway is formed of a homogeneous material.

7. The packaged integrated circuit of claim 1, wherein portions of the thermal pathway are formed of different materials.

8. The packaged integrated circuit of claim 1, wherein the thermal pathway is formed of a metal.

9. The packaged integrated circuit of claim 1, wherein a portion of the thermal pathway is formed of a thermally conductive compound.

10. The packaged integrated circuit of claim 1, wherein the thermal pathway extends above a topmost surface of the passivation layer.

11. The packaged integrated circuit of claim 1, wherein the thermal pathway has a topmost surface that is at a same height as a topmost surface of the passivation layer.

12. The packaged integrated circuit of claim 1, wherein the integrated circuit is a flip chip.

13. The packaged integrated circuit of claim 1, wherein the integrated circuit is wire bond chip.

14. The packaged integrated circuit of claim 1, wherein the encapsulant is a ceramic lid.

15. The packaged integrated circuit of claim 1, wherein the encapsulant is an epoxy.

16. The packaged integrated circuit of claim 1, wherein the package substrate is a ceramic piece.

17. The packaged integrated circuit of claim 1, wherein the package substrate is a built-up circuit board.

18. The packaged integrated circuit of claim 1, wherein the heat sink is formed of a metal.

19. The packaged integrated circuit of claim 1, wherein the heat sink is formed of copper.

20. The packaged integrated circuit of claim 1, wherein at least portions of the heat sink are formed of a first material and at least portions of the thermal pathway are also formed of the first material.

\* \* \* \* \*